(12) United States Patent
Bang et al.

(10) Patent No.: US 9,093,407 B2
(45) Date of Patent: Jul. 28, 2015

(54) ORGANIC LIGHT EMITTING DISPLAY

(71) Applicant: Samsung Display Co., Ltd., Yongin, Gyeonggi-Do (KR)

(72) Inventors: Hyun-Chol Bang, Yongin (KR); Won-Kyu Kwak, Yongin (KR); Se-Ho Kim, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/017,404

(22) Filed: Sep. 4, 2013

(65) Prior Publication Data

US 2014/0332764 A1    Nov. 13, 2014

(30) Foreign Application Priority Data

May 9, 2013    (KR) .................. 10-2013-0052588

(51) Int. Cl.
*H01L 51/00* (2006.01)
*H01L 27/32* (2006.01)
*G09G 3/32* (2006.01)

(52) U.S. Cl.
CPC .......... *H01L 27/3262* (2013.01); *G09G 3/3208* (2013.01)

(58) Field of Classification Search
CPC .............. H01L 27/3262; G02F 1/1362; G02F 2001/1635; G09G 3/3208
USPC ................................ 257/40, 59, 72
See application file for complete search history.

(56) References Cited

U.S. PATENT DOCUMENTS

2010/0270678 A1*  10/2010  Ikeda et al. ............ 257/773

FOREIGN PATENT DOCUMENTS

| JP | 10-039337 A | 2/1998 |
|---|---|---|
| JP | 2001-111053 A | 4/2001 |

* cited by examiner

*Primary Examiner* — Tu-Tu Ho
(74) *Attorney, Agent, or Firm* — Cantor Colburn LLP

(57) ABSTRACT

An organic light emitting diode ("OLED") display includes: a substrate including a plurality of pixel areas; a plurality of switching transistors and a plurality of driving transistors on the substrate; and an organic light emitting element respectively connected to a switching transistor and a driving transistor among the plurality of switching transistors and the plurality of driving transistors. The driving transistor includes a semiconductor which overlaps a plurality of adjacent pixel areas.

17 Claims, 12 Drawing Sheets

ORGANIC LIGHT EMITTING DISPLAY

This application claims priority to Korean Patent Application No. 10-2013-0052588 filed on May 9, 2013, and all the benefits accruing therefrom under 35 U.S.C. §119, the entire contents of which are incorporated herein by reference.

BACKGROUND (a) Field

The invention relates to an organic light emitting diode ("OLED") display.

(b) Description of the Related Art

An OLED display includes two electrodes and an organic emission layer disposed between the two electrodes. Electrons injected from one electrode and holes injected from the other electrode are combined in the organic emission layer such that excitons are formed, and light is emitted by energy generated from the excitons.

The OLED display further includes a plurality of pixels each including an OLED as a self-emitting light element, a plurality of thin film transistors and a capacitor to drive the OLED. The plurality of thin film transistors includes a switching transistor and a driving transistor.

SUMMARY

Accordingly, one or more exemplary embodiment of the invention provides an organic light emitting diode ("OLED") display having a high resolution with minimized spot defects, by sufficiently ensuring a channel length even though a size of a pixel is decreased to achieve the high resolution.

An exemplary embodiment of an OLED display according to the invention includes: a substrate including a plurality of pixel areas; a plurality of switching transistors and a plurality of driving transistors on the substrate; and an organic light emitting element respectively connected to a switching transistor and a driving transistor among the plurality of switching transistors and the plurality of driving transistors. The driving transistor includes a semiconductor which overlaps a plurality of adjacent pixel areas.

The semiconductor may include a source region, a channel region, and a drain region, and the channel region may be disposed in the plurality of adjacent pixel areas which are overlapped by the driving transistor.

The semiconductor may include a source region, a channel region, and a drain region, and the source region and the drain region may be disposed in different pixel areas among the plurality of adjacent pixel areas which are overlapped by the driving transistor.

The channel region may be disposed in the different pixel areas in which the source region and the drain region are disposed.

The plurality of pixel areas may form rows and columns, and in the columns, the source regions and the drain regions of driving transistors connected to organic light emitting elements different from each other, may be alternately disposed.

The alternating source regions and drain regions of the driving transistors connected to the organic light emitting elements different from each other, may be disposed in a same pixel area.

The plurality of pixel areas may form rows and columns, and in the columns, the source regions or the drain regions of driving transistors connected to organic light emitting elements different from each other, may be repeated.

A portion of the channel region may be disposed in a pixel area between the different pixel areas in which the source region and the drain region are disposed.

The plurality of pixel areas may form rows and columns, and the source regions, the channel regions and the drain regions of driving transistors connected to organic light emitting elements different from each other, may be alternately disposed.

The source regions, the channel regions and the drain regions of the driving transistors connected to the organic light emitting elements different from each other according to the columns, may be disposed in a same pixel area.

The plurality of pixel areas may form rows and columns, and in the columns, the source regions, the channel regions or the drain regions of driving transistors connected to organic light emitting elements different from each other, may be repeated.

The organic light emitting element may include a first electrode connected to the drain region, an organic emission layer positioned on the first electrode, and a second electrode positioned on the organic emission layer, and the first electrode may be disposed in a same pixel area in which the drain region of the semiconductor is disposed.

The semiconductor may include a source region, a drain region and a channel region, the source region and the drain region may be disposed in different pixel areas among the plurality of adjacent pixel areas which are overlapped by the driving transistor, the organic light emitting element may include a first electrode connected to the drain region, an organic emission layer positioned on the first electrode, and a second electrode positioned on the organic emission layer, and the first electrode may be disposed in a different pixel area from that in which the drain region of the semiconductor is disposed.

A source electrode connected to the source region, and a drain electrode connected to the drain region may be further included.

A plurality of scan signal lines on the substrate and a plurality of data lines and driving voltage lines crossing the scan signal lines may be further included, the plurality of adjacent pixel areas overlapped by the driving transistor forms a group, the switching transistors disposed in the pixel areas forming the group may be connected to different data lines, and the driving transistors disposed in the pixel areas forming the group may be connected to different driving voltage lines.

A scan signal line among the plurality of scan signal lines may include a first sub-scan signal line portion and a second sub-scan signal line portion which are simultaneously applied with a signal, and the switching transistors disposed in the pixel areas forming the group may include a first switching transistor connected to the first sub-scan signal line portion and a second switching transistor connected to the second sub-scan signal line portion.

A plurality of scan signal lines positioned on the substrate and a plurality of data lines and driving voltage lines crossing the scan signal lines may be further included, and the plurality of adjacent pixel areas overlapped by the driving transistor forms a group, the switching transistors disposed in the pixel areas forming the group may be connected to different data lines, and the driving transistors disposed in the pixel areas forming the group may be connected to a same driving voltage line.

In one or more exemplary embodiment of the invention, as the driving thin film transistor is disposed in a plurality of pixel areas, the channel length may be ensured even though the size of the pixel is decreased.

Accordingly, the OLED display minimizing the spot defects may be provided.

BRIEF DESCRIPTION OF THE DRAWINGS

The above and other features of the invention will become more apparent by describing in further detail exemplary embodiments thereof with references to the accompanying drawings, in which.

DETAILED DESCRIPTION

Figure 1:
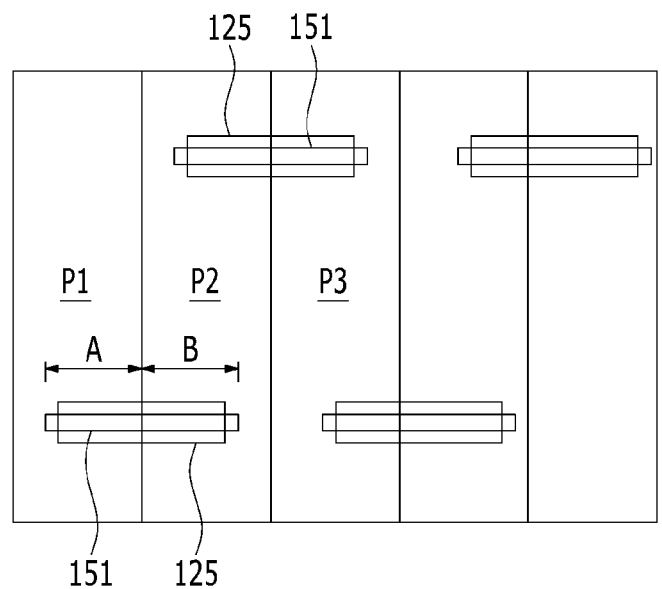
FIG. 1 is a schematic top plan view of an exemplary embodiment of an organic light emitting diode ("OLED") display according to the invention.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An organic light emitting diode ("OLED") display includes a plurality of pixels each including an OLED as a self-emitting light element, a plurality of thin film transistors and a capacitor to drive the OLED. The plurality of thin film transistors includes a switching transistor and a driving transistor. The light emitting element of the OLED display displays various grayscales according to fine current gradations controlled by the driving transistor. To increase a driving range of the driving transistor, a channel length of the driving transistor is increased.

However, where a size (e.g., planar dimension) of a pixel or pixel area is decreased to increase resolution of the OLED display, ensuring sufficient length of the channel of the driving transistor in the pixel may be difficult. Resultantly, spots may undesirably be generated compared with an OLED display having a low resolution. Therefore, there remains a need for an improved OLED display having increased resolution, which provides a sufficient driving transistor channel length to reduce or effectively prevent display defects such as spots from being generated.

Hereinafter, the invention will be described more fully with reference to the accompanying drawings, in which exemplary embodiments of the invention are shown. As those skilled in the art would realize, the described embodiments may be modified in various different ways, all without departing from the spirit or scope of the invention.

FIG. 1 is a schematic top plan view of an exemplary embodiment of an OLED display according to the invention.

As shown in FIG. 1, an exemplary embodiment of an OLED display according to the invention includes a plurality of pixel areas. The plurality of pixel areas is arranged in rows and columns.

The plurality of pixel areas may include a red pixel area displaying a red color, a green pixel area displaying a green color, and a blue pixel area displaying a blue color, but the invention is not limited thereto. The red color, the green color, and the blue color are one example of primary colors to display full colors, and the red pixel area, the green pixel area, and the blue pixel area are primary pixel areas for the full colors. In an exemplary embodiment of the OLED display, three pixel areas may be repeated according to the row and/or the column. The row may extend in a row direction, and the column may extend in a column direction.

Referring to the arrangement of the plurality of pixel areas in the OLED display, a plurality of red pixel areas, a plurality of green pixel areas, and a plurality of blue pixel areas may be respectively alternately arranged according to the row, and pixel areas of a same color may be arranged according to the column. The red pixel area, the green pixel area, and the blue pixel area may be substantially equivalent planar areas of the OLED display, but the invention is not limited thereto. Also, the red pixel area, the green pixel area, and the blue pixel area may be alternately disposed according to the row and may be disposed with a pentile shape. The red pixel area, the green pixel area, and the blue pixel area may be repeatedly disposed beginning from a pixel area positioned at a left side of FIG. 1 (e.g., from a leftmost or outermost pixel area).

Each pixel area of FIG. 1 includes a portion of one or more thin film transistor. The thin film transistor includes a semiconductor 151, a gate electrode 125 overlapping the semiconductor 151, and a source electrode (not shown) and a drain electrode (not shown) physically and/or electrically connected to the semiconductor 151.

The semiconductor 151 of the thin film transistor may be positioned completely in one pixel area, or may be positioned to overlap a plurality of pixel areas that are neighboring in the row direction.

With respect to the left side of FIG. 1, pixel areas include a first pixel area P1 and a second pixel area P2. The semiconductor 151 of the leftmost thin film transistor in the bottom row of thin film transistors extends to overlap two pixel areas P1 and P2. The semiconductor 151 includes a first portion A positioned at the first pixel area P1 and a second portion B positioned at the second pixel area P2.

The semiconductor 151 of the leftmost thin film transistor in the top row of thin film transistors extends to overlap second and third pixel areas P2 and P3, and includes a first portion A and a second portion B. The second portion B is positioned at the third pixel area P3 that is adjacent to the second pixel area P2 in the row direction.

The gate electrode 125 overlapping the semiconductor 151 of the leftmost thin film transistor in the bottom row of thin film transistors, is also elongated to overlap the two pixel areas P1 and P2. The elongated and uniform width planar shape of the gate electrode 125 overlaps a similar shape of the semiconductor 151, except for opposing ends of the semiconductor 151.

Also, in the second pixel area P2, the gate electrode 125 positioned on the semiconductor 151 of the leftmost thin film transistor in the top row of thin film transistors is elongated to overlap the shape of semiconductor 151 except for opposing ends of the semiconductor 151.

The semiconductor 151 of the thin film transistor includes a source region, a channel region, and a drain region. The source and drain regions may be separated from each other and at the opposing ends of the semiconductor 151, and the channel region may be exposed between the spaced apart source and drain regions. Referring to FIG. 1, the channel region of a thin film transistor is positioned at a plurality of pixel areas, and the source region and the drain region are respectively positioned at different pixel areas. That is, referring to the leftmost thin film transistor in the bottom row of thin film transistors, the source region is positioned at the first portion A of the semiconductor 151 and the drain region is positioned at the second portion B of the semiconductor 151, such that the source and drain regions are respectively positioned at the first pixel area P1 and the second pixel area P2. Also, since the channel region is between the source region and the drain region, and the channel region may be simultaneously positioned at the two adjacent pixel areas P1 and P2 in which the source region and the drain region are respectively positioned.

Referring to the row direction of FIG. 1, the first portion A and the second portion B of semiconductors 151 of different thin film transistors arranged adjacent in the row direction, are alternately positioned according to the row direction of the pixel area. In one exemplary embodiment, the source region may be positioned at the first portion A and the drain region may be positioned at the second portion B, but the invention is not limited thereto. The first portion A and the second portion B of semiconductors 151 of different thin film transistors arranged adjacent in the column direction are positioned at one pixel area.

In an exemplary embodiment, if the semiconductors of the thin film transistors are disposed over a plurality of pixel areas, an overall or collective channel length may be increased. In one exemplary embodiment, for example, if the semiconductors 151 of the driving thin film transistors of the OLED display are disposed overlapping a plurality of pixel areas, although the size of an individual pixel or pixel area is decreased, the collective channel length of the driving thin film transistors of the individual pixel or pixel area may be sufficiently increased.

Accordingly, an increase in the overall or total channel length of a plurality of driving thin film transistors widens the driving range of the OLED display such that undesirable display artifacts such as the spots due to a change of electrical driving current may be minimized.

Figure 2:
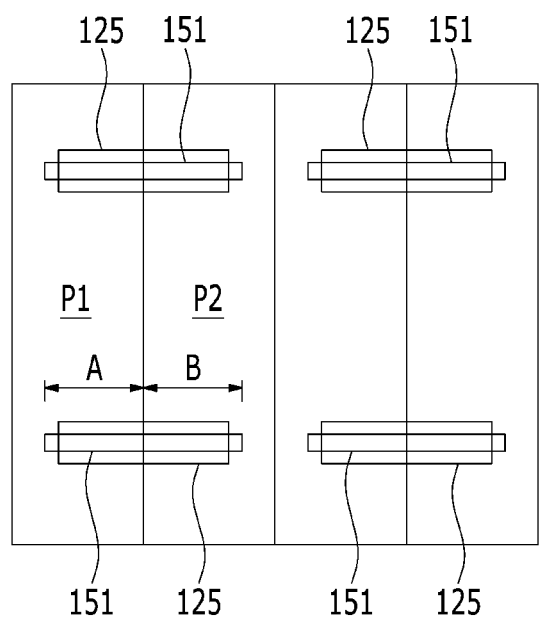
FIG. 2 to FIG. 4 are schematic top plan views of other exemplary embodiments of an OLED display according to the invention, respectively.
Figure 3:
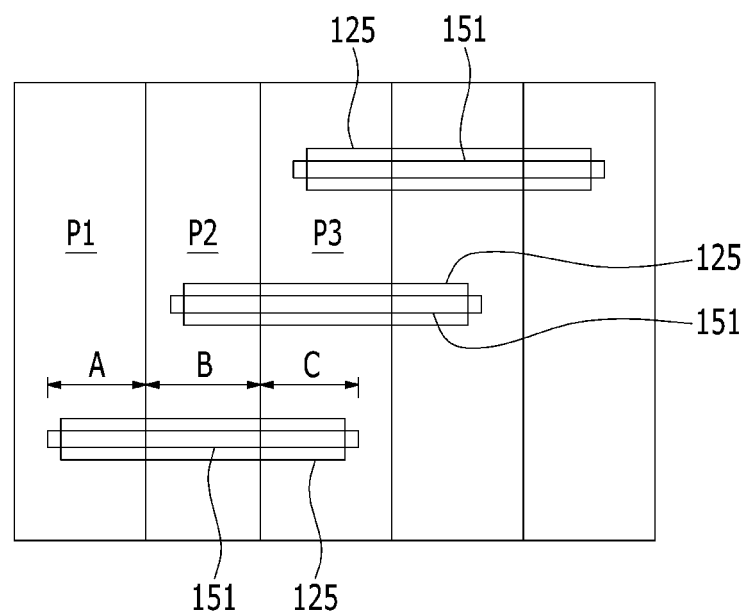
Figure 4:
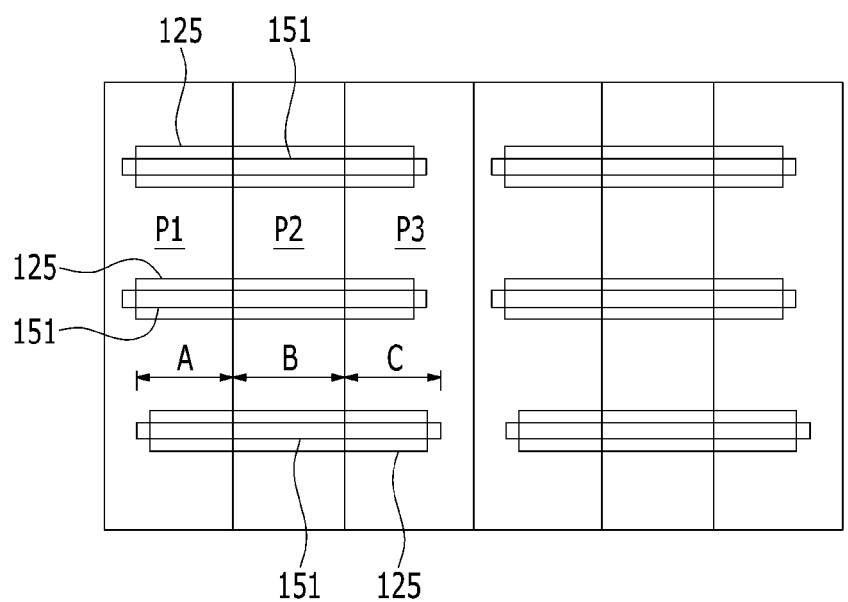

FIG. 2 to FIG. 4 show schematic top plan views of exemplary embodiments of an OLED display according to the invention, respectively.

Features of FIG. 2 to FIG. 4 are substantially the same as those in FIG. 1 such that differences will be described in detail.

The OLED display of FIG. 2 to FIG. 4 includes the first pixel area P1, the second pixel area P2, and the third pixel area P3. A plurality of pixel areas are disposed to form the rows and the columns of the OLED display.

The semiconductors 151 of a thin film transistors of FIG. 2 includes the first portion A and the second portion B. The same portions of semiconductors 151 of thin film transistors adjacent in the column direction are positioned in a same pixel area. That is, referring to FIG. 2, the first portion A including the source region is repeatedly positioned in the first pixel area P1 and the second portion B including the drain region is repeatedly positioned in the second pixel area P2 adjacent in the row direction to the first pixel area P1.

Accordingly, each of the source regions and/or the drain regions of a plurality of thin film transistors at a single pixel area may be positioned at the single pixel area.

The semiconductors 151 of the thin film transistors of FIG. 3 and FIG. 4 includes the first portion A, the second portion B and a third portion C. The first portion A, the second portion B and the third portion C are respectively positioned overlapping three pixel areas P1, P2 and P3. The source region is positioned at the first portion A and the drain region is positioned at the third portion C such that the source are drain regions are respectively positioned at different pixel areas spaced apart from (e.g., not directly adjacent to) each other in the row direction. Where the channel region is between the source and drain regions, the channel region is positioned at a plurality of pixel areas. The channel region is connected to the source region and the drain region such that the channel region is simultaneously positioned overlapping the two pixel areas P1 and P3 in which the source region and the drain region are positioned, in addition to being positioned at the pixel area P2 between the two pixel areas P1 and P3.

In the semiconductors 151 of the thin film transistors of FIG. 3, as shown in FIG. 1, the first portion A including the source region, the second portion B including the channel region and the third portion C including the drain region are alternately positioned according to the column direction of a pixel area. That is, a same pixel area does not include the same portion of the semiconductors 151 of the thin film transistors. Accordingly, two regions among the source region, the drain region and the channel region of different thin film transistors may be positioned at one pixel area.

Similar to the structure shown in FIG. 2, a same region of the semiconductors of the thin film transistors of FIG. 4 is repeatedly positioned at the same pixel area. That is, one region among the source region, the drain region and the channel region is arranged in the column of one pixel area. Accordingly, the one region among the source region, the drain region and the channel region of the different thin film transistors may be plurally positioned in the one pixel area.

In the illustrated exemplary embodiments, the semiconductor overlaps two adjacent pixel areas or three adjacent pixel areas, however the semiconductor may overlap more than three adjacent pixel areas.

In one or more exemplary embodiment of the invention, if the channel regions of the thin film transistors are disposed over a plurality of pixel areas, an overall or collective channel length may be increased even though the area of a pixel or pixel area is decreased. Accordingly, if the semiconductors of the driving thin film transistors of the OLED display are disposed over a plurality of pixel areas, even though the size of the pixel or pixel areas is reduced, the driving range of the driving thin film transistors is increased by increasing the collective channel length of the driving thin film transistors such that undesirable display artifacts such as the spots due to a change of electrical driving current may be minimized.

Next, an OLED display including one or more of the thin film transistors of FIG. 1 to FIG. 4 will be further described in detail with reference to FIGS. 5 to 12.

Figure 5:
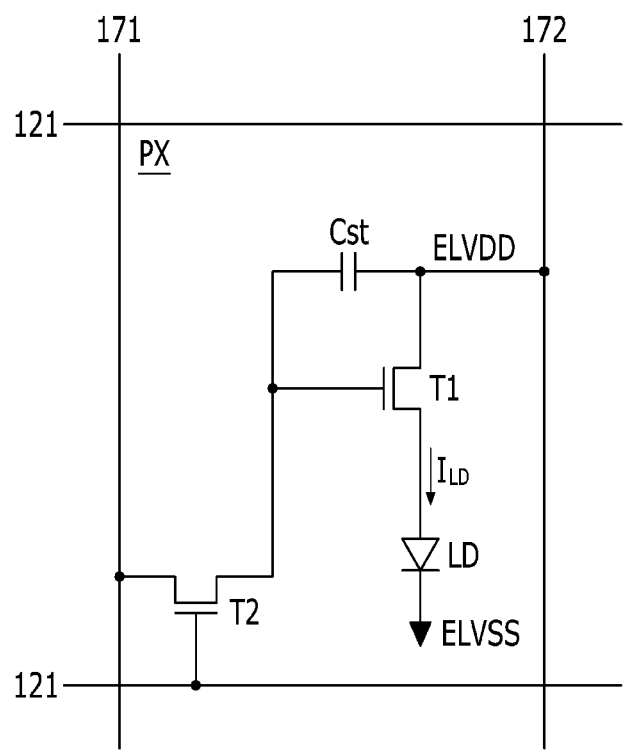
FIG. 5 is an equivalent circuit diagram of an exemplary embodiment of a pixel area of an OLED display according to the invention.

FIG. 5 is an equivalent circuit of an exemplary embodiment of one pixel area of an OLED display according to the invention.

Referring to FIG. 5, an exemplary embodiment of OLED display according to the invention includes a plurality of signal lines 121, 171 and 172, and a pixel PX connected thereto.

The signal lines include one or more scan signal line 121 for transmitting gate signals (or scanning signals), one or more data line 171 for transmitting data signals, and one or more driving voltage line 172 for transmitting a driving voltage. A plurality of scan signal lines 121 extends substantially in the row direction and substantially parallel to each other, and a plurality of data lines 171 extends substantially in the column direction and substantially parallel to each other. A plurality of driving voltage lines 172 extends substantially in the column direction and substantially parallel to each other, but the invention is not limited thereto. The plurality of driving voltage lines 172 may extend in the row direction and/or the column direction, and may form a mesh or lattice shaped arrangement.

One pixel PX includes a switching transistor T2, a driving transistor T1, a storage capacitor Cst, and an organic light emitting element LD.

The switching transistor T2 includes a control terminal connected to a gate line 121 among the plurality of gate (scan signal) lines 121, an input terminal connected to a data line among the plurality of data lines 171, and an output terminal connected to the driving transistor T1. The switching transistor T2 transmits data signals applied to the data line 171 to the driving transistor T1 in response to a gate signal applied to the gate line 121.

The driving transistor T1 has a control terminal connected to the switching transistor T2, an input terminal connected to the driving voltage line 172, and an output terminal connected to the organic light emitting element LD. The driving transistor T1 drives an output electrical current $I_{LD}$ having a magnitude depending on the voltage between the control terminal and the output terminal thereof.

The storage capacitor Cst is connected between the control terminal and the input terminal of the driving transistor T1. The storage capacitor Cst stores a data signal applied to the control terminal of the driving transistor T1 and maintains the data signal after the switching transistor T2 turns off.

The organic light emitting element LD representing an OLED includes an anode connected to the output terminal of the driving transistor T1 and a cathode connected to a common voltage ELVSS. The organic light emitting element LD emits light having an intensity depending on the output electrical current $I_{LD}$ of the driving transistor T1, and the OLED display employs the emitting light to thereby display images. The organic light emitting element LD may include an organic material uniquely emitting at least one primary color among a plurality of three primary colors including, but not limited to, red, green and blue. The OLED display may display desired images by a spatial sum thereof, but the invention is not limited thereto.

Figure 6:
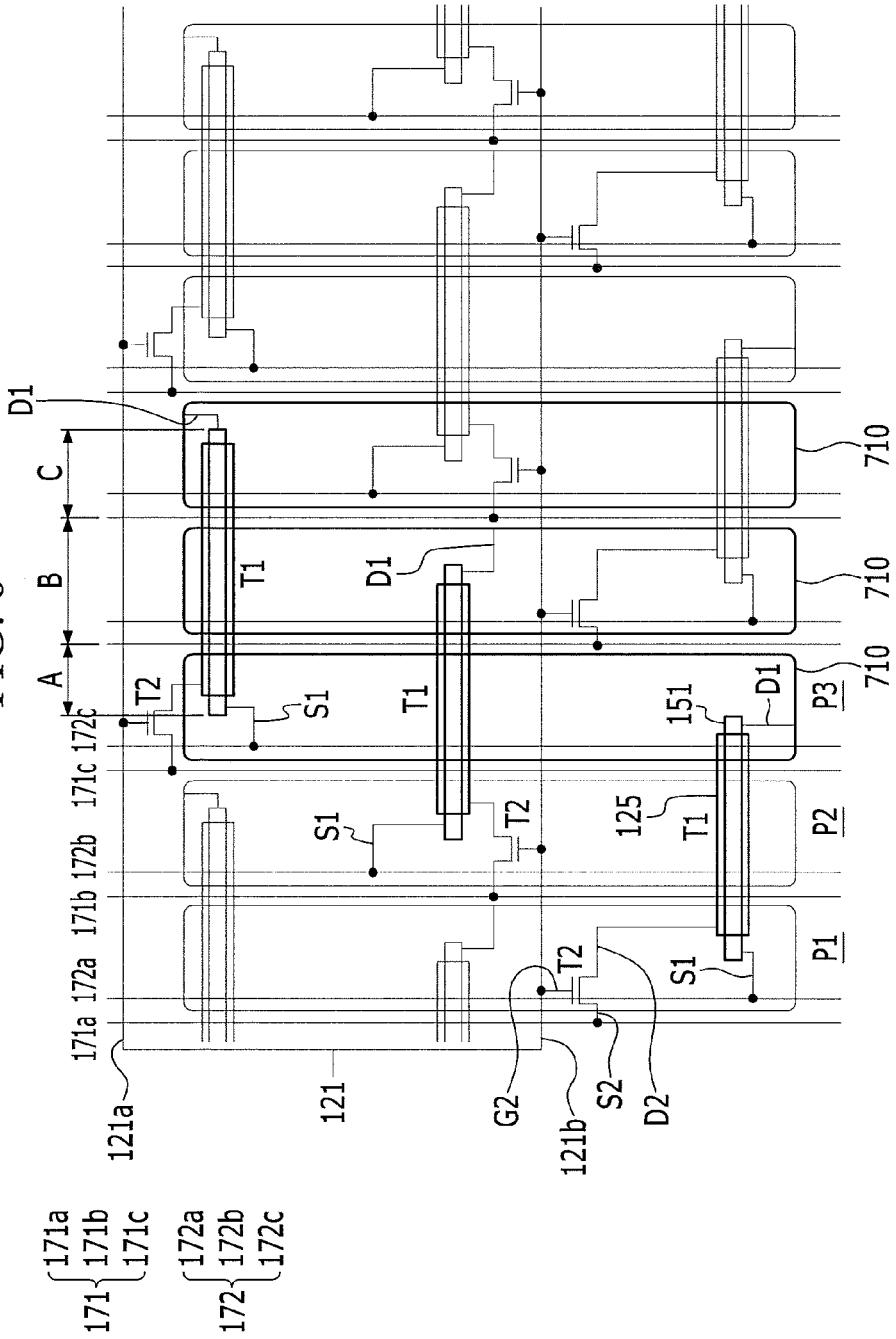
FIG. 6 is a schematic top plan view of another exemplary embodiment of an OLED display according to the invention.
Figure 7:
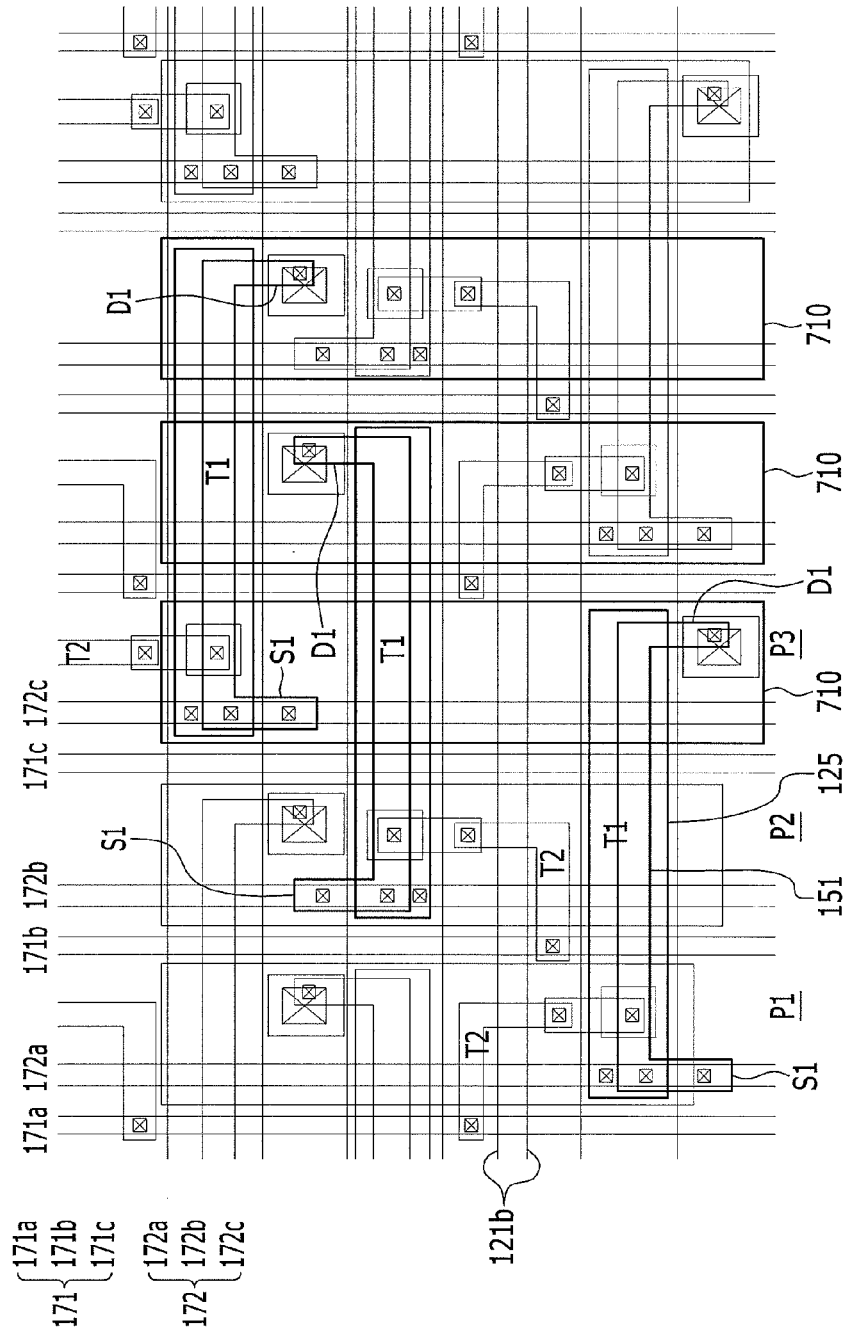
FIG. 7 is a plan view of the OLED display shown in FIG. 6.

FIG. 6 is a schematic top plan view of another exemplary embodiment of an OLED display according to the invention, and FIG. 7 is a plan view of the OLED display shown in FIG. 6.

In the driving thin film transistor of the OLED display shown in FIG. 6 and FIG. 7, the semiconductor of the driving thin film transistor may be positioned overlapping a plurality of pixel areas. Hereafter, an example in which the semiconductor is positioned over three pixel areas, as shown in FIG. 3, will be described.

Referring to FIG. 6 and FIG. 7, in the OLED display, the scan signal line 121 is elongated in a first direction, and the data line 171 and the driving voltage line 172 are elongated in a second direction intersecting the first direction in which the scan signal line 121 is elongated.

Hereinafter, for better understanding and ease of description, a region in which a first electrode 710 is disposed is referred to as the pixel area, but the invention is not limited thereto. In an exemplary embodiment, the pixel area may be defined by another element of the OLED display.

The OLED display may include a plurality of pixels PX respectively including the driving transistor and switching transistor connected to the scan signal line 121, the data line 171, and the driving voltage line 172. The plurality of pixels may be respectively disposed at a plurality of pixel areas.

Each pixel includes the first thin film transistor T1 as the driving element and the second thin film transistor T2 as the switching element. The first thin film transistor T1 and the second thin film transistor T2 respectively include a gate electrode, a source electrode and a drain electrode.

In each of the first and second thin film transistors T1 and T2, the source electrode and the drain electrode are respectively connected to a source region and a drain region of a semiconductor. The source electrode and the drain electrode may be a separate element from the source region and drain region of the semiconductor and include conductive material such as metal. Alternatively, the source and drain regions of the semiconductor may define the source and drain electrodes, respectively. The scan signal line 121 may be directly connected to the source region and drain region (or the source and drain electrodes), but the invention is not limited thereto. Accordingly, the source electrode and the drain electrode may include the source region and the drain region of the semiconductor and/or a separate electrode element including the metal material.

The second thin film transistor T2 includes the gate electrode G2 connected to the scan signal line 121, the source electrode S2 connected to the data line 171, and the drain electrode D2 connected to the gate electrode 125 of the first thin film transistor T1.

The first thin film transistor T1 includes the gate electrode 125 connected to the drain electrode D2 of the second thin film transistor T2, the source electrode S1 connected to driving voltage line 172, and the drain electrode D1 connected to the first electrode 710 as anode of the OLED display.

The scan signal line 121 of FIG. 6 and FIG. 7 includes a first scan signal line portion 121a and a second scan signal line portion 121b. The first scan signal line portion 121a and the second scan signal line portion 121b are electrically connected to each other and simultaneously input with the same signal. The first and second scan signal line portions 121a and 121b may be a single, unitary, indivisible member. The first scan signal line portion 121a is connected to the second thin film transistor T2 of the third pixel area P3, and the second scan signal line 121b is connected to the second thin film transistor T2 of the first pixel area P1 and the second pixel area P2.

As shown in FIG. 1 to FIG. 4, the gate electrode 125 and the semiconductor 151 of a thin film transistor may be disposed at a plurality of pixel areas. In the exemplary embodiment of FIG. 6, as shown in FIG. 3, the gate electrode 125 and the semiconductor 151 of the first thin film transistor T1 are disposed at three adjacent pixel areas. The three sequential pixel areas are referred to as the first pixel area P1, the second pixel area P2 and the third pixel area P3 with respect to the leftmost side of FIG. 6.

The semiconductor 151 of the first thin film transistor T1 includes the first portion including the source region connected to the source electrode S1, the third portion including the drain region connected to the drain electrode D1, and the second portion including the channel region connecting between the source region and the drain region.

The semiconductor 151 of the first thin film transistor T1 overlaps pixel areas from the first pixel area P1 to the third pixel area P3. The first portion of the semiconductor 151 in which the source region of the first thin film transistor T1 is disposed, is positioned at the first pixel area P1. The third portion of the semiconductor 151 in which the drain region of the first thin film transistor T1 is disposed is positioned at the third pixel area P3. Also, the second portion of the semiconductor 151 and the channel region of the first thin film transistor T1 is positioned at a plurality of pixel areas P1, P2 and P3. The channel region is physically and/or electrically connected to the source region and the drain region such that the channel region is positioned not only at two pixel areas P1 and P3 in which the source region and the drain region are positioned, but also at the pixel area P2 positioned between two pixel areas P1 and P3.

The electrical signal from the drain electrode D1 connected to the drain region of the first thin film transistor T1, is applied to the first electrode 710. In an exemplary embodiment, if the semiconductor 151 of the first thin film transistor T1 is disposed at a plurality of pixel areas, the first electrode 710 may be positioned at the same pixel area as the drain region of the first thin film transistor T1 connected to the first electrode 710, but the invention is not limited thereto. That is, while the drain electrode D1 connected to the first electrode 710 positioned at the third pixel area P3 of FIG. 6 is positioned at the same third pixel area P3, and the drain region of the semiconductor 151 connected to the drain electrode D1 is positioned at the same third pixel area P3, the semiconductor 151 is positioned over the second pixel area P2 and the third pixel area P3 such that the source region is positioned only at the first pixel area P1.

The first thin film transistor T1 of the first pixel area P1 is connected to the driving voltage line 172a of the first pixel area P1, the first thin film transistor T1 of the second pixel area P2 is connected to the driving voltage line 172b of the second pixel area P2, and the first thin film transistor T1 of the third pixel area P3 is connected to the driving voltage line 172c of the third pixel area P3.

That is, when three pixel areas in which that the semiconductor of the first thin film transistor T1 is disposed is referred as one group, the second thin film transistors T2 positioned at the pixel areas forming the group are connected to different data lines 171a, 171b and 171c.

Accordingly, the first portion A, the second portion B and the third portion C of the semiconductors 151 of the different first thin film transistors T1 positioned at the pixel areas forming the group may be alternately positioned in the pixel areas forming the group, in the column direction.

In this way, the source region of the first thin film transistor T1 is positioned at the same first pixel area P1 as the second thin film transistor T2. However, the drain region of the first thin film transistor T1 is positioned at the pixel area P3 different from the first pixel area P1 in which the second thin film transistor T2 is positioned. Alternatively, one of the portions among the first portion A, the second portion B, and the third portion C of the different first thin film transistors T1 positioned at the pixel areas forming the group may each be positioned at the same pixel area.

Accordingly, if the second thin film transistor T2 of the first pixel area P1 is turned on, the organic light emitting element of the third pixel area P3 in which is positioned the first electrode 710 connected to the first thin film transistor T1 of the first pixel area P1, emits the light.

In an exemplary embodiment, if individual lengths of the semiconductor regions of the first thin film transistors representing the driving transistors of an OLED display are increased, the overall channel length of the OLED display is increased such that the driving range of the OLED display is widened, thereby reducing or effectively preventing undesirable display artifacts such as the spots.

Figure 8:
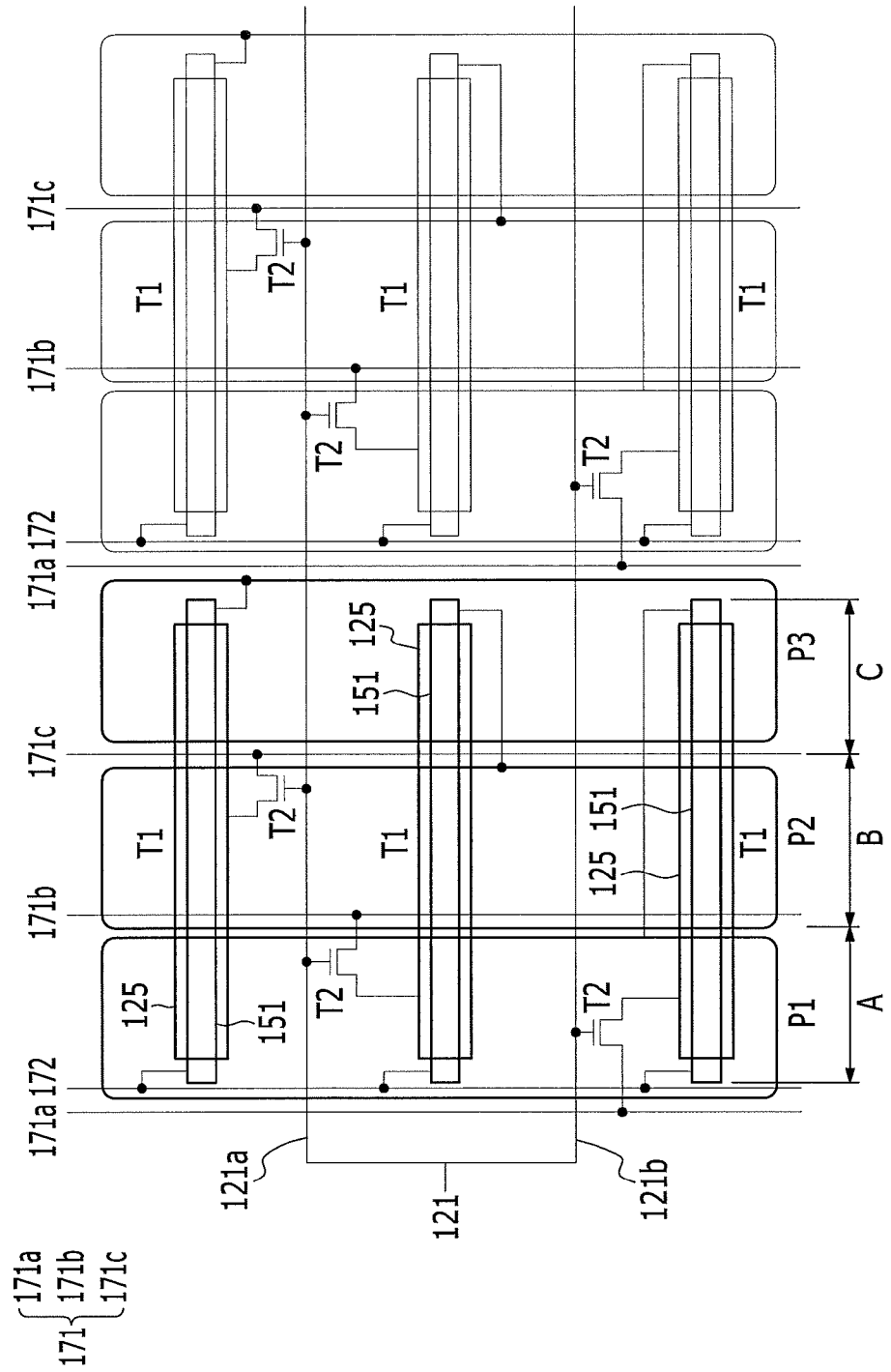
FIG. 8 is a schematic top plan view of still another exemplary embodiment of an OLED display according to the invention.
Figure 9:
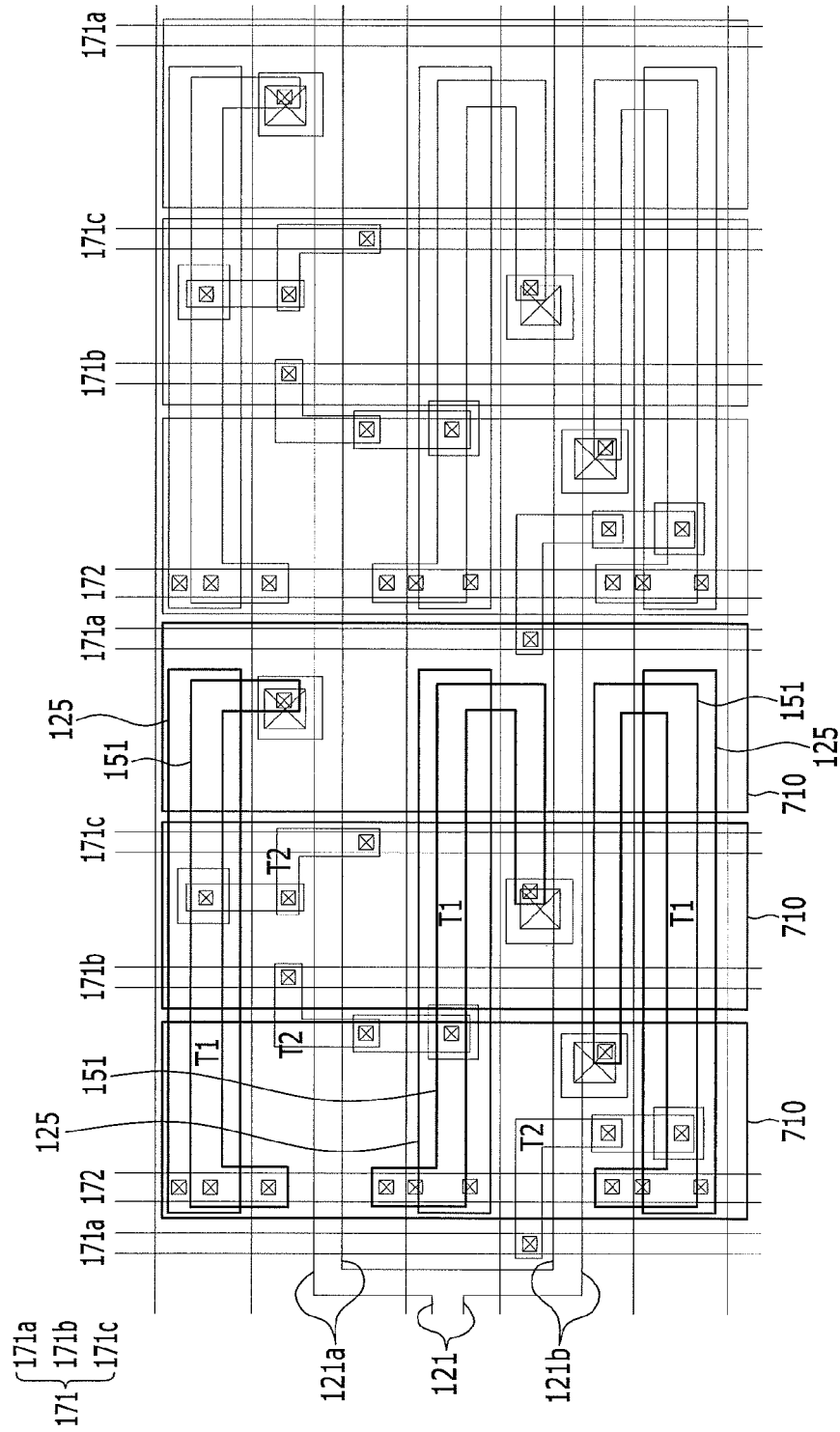
FIG. 9 is a plan view of the OLED display shown in FIG. 8.

FIG. 8 is a schematic top plan view of still another exemplary embodiment of an OLED display according to the invention, and FIG. 9 is a plan view of the OLED display shown in FIG. 8.

Most of the features of FIG. 8 and FIG. 9 are substantially the same as those of FIG. 6 and FIG. 7 such that differences will be described in detail.

In the OLED display of the FIG. 8 and FIG. 9, differently from FIG. 6 and FIG. 7, three pixels are connected to one driving voltage line 172.

In detail, each pixel of FIG. 8 and FIG. 9 includes the first thin film transistor of the driving transistor and the second thin film transistor of the switching transistor. As shown in FIG. 4, the semiconductor 151 of the first thin film transistor T1 is disposed overlapping the first pixel area P1 to the third pixel area P3. The semiconductor 151 of the first thin film transistor T1 includes the first portion A, the second portion B and the third portion C that are respectively disposed at the first pixel area P1 to the third pixel area P3. The first portion A includes the source region, the third portion C includes the drain region, and the second portion B connecting the first portion A and the third portion C includes the channel region.

The scan signal line 121 includes the first scan signal line portion 121a and the second scan signal line portion 121b. In the first pixel area P1, the second thin film transistor T2 electrically connected to the gate electrode of the first thin film transistor T1 is connected to the second scan signal line portion 121b. Here, the first thin film transistor T1 is connected to the first electrode located in the first pixel area P1.

In the second and third pixel area P2, P3, the second thin film transistor T2 electrically connected to the gate electrode of the first thin film transistor T1 is connected to the first scan signal line portion 121a. Here, the first thin film transistor T1 is connected to the first electrode respectively located in the second and third pixel area P2, P3.

When the first pixel area P1 to the third pixel area P3 are referred to as one group, the first thin film transistor T1 positioned in the one group of pixel areas is connected to the same driving voltage line 172.

Differently from FIG. 6 and FIG. 7, the driving voltage line 172 of FIG. 8 and FIG. 9 is disposed in one-to-three correspondence. In FIG. 6 and FIG. 7, for example, the driving voltage line 172 is in one-to-one correspondence with the group of pixel areas P1, P2 and P3.

All the first thin film transistors T1 included in one group of pixel areas are connected to the same driving voltage line 172 such that the first portion A of the first thin film transistors T1 is positioned at the first pixel area P1, the second portion B is positioned at the second pixel area P2, and the third portion C is positioned at the third pixel area P3. Accordingly, the first portion A including the source region of the first thin film transistors T1 of the first pixel area P1 to the third pixel area P3 is repeatedly positioned in a same pixel area.

That is, as illustrated in FIG. 8 and FIG. 9, the source region of all the first thin film transistors T1 included in one group of pixel areas is connected to the same driving voltage line 172 and is positioned at the first pixel area P1, and the drain region of all the first thin film transistors T1 included in the one group of pixel areas is positioned at the third pixel area P3.

The first electrode 710 of each organic light emitting element connected to the drain region may be respectively disposed at one pixel area of the first pixel area P1 to the third pixel area P3 defining the group of pixel areas. The first electrode 710 is positioned at the pixel area adjacent to the data lines 171a, 171b, and 171c which are respectively connected to the second thin film transistors T2 positioned at the first pixel area P1 to the third pixel area P3. The first electrode 710 may overlap a data line 171, or may be completely disposed between adjacent data lines 171.

That is, the first electrode 710 connected to the first data line 171a is positioned at the first pixel area P1. The first electrode 710 connected to the second data line 171b is positioned at the second pixel area P2. And the first electrode 710 connected to the third data line 171c is positioned at the third pixel area P3.

In the above exemplary embodiment, one driving voltage line is connected to a group of pixel areas such that the space occupied by the driving voltage lines may be reduced.

Figure 10:
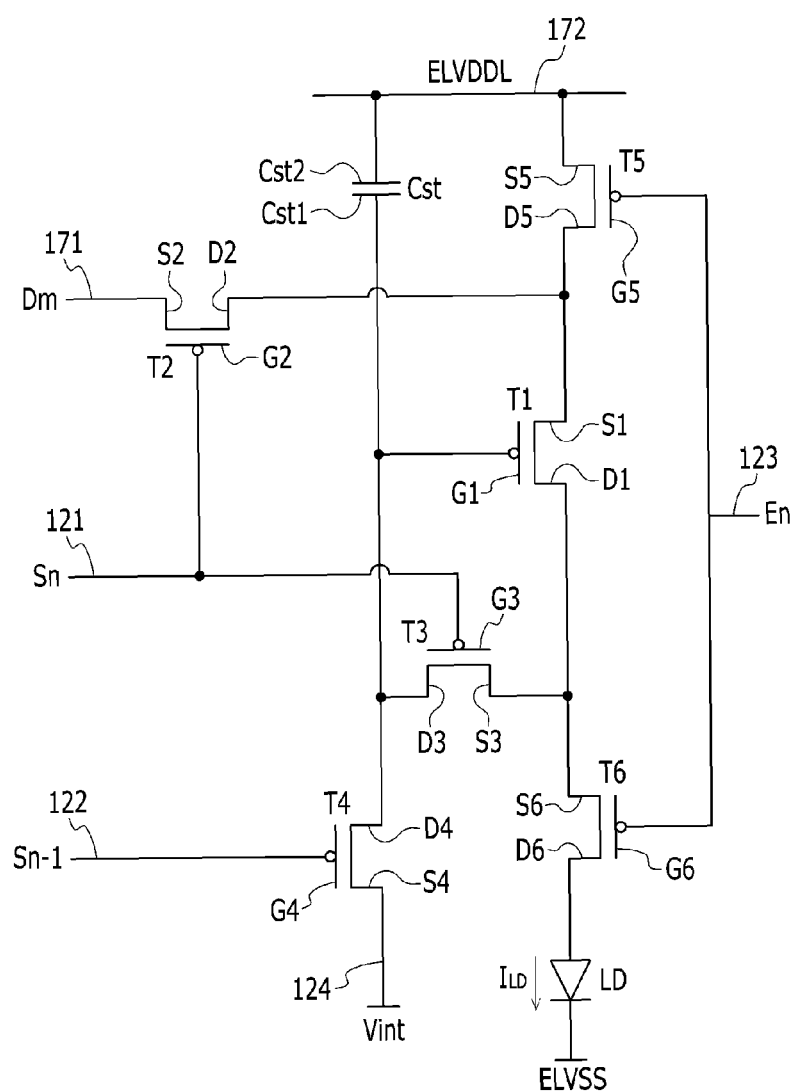
FIG. 10 is an equivalent circuit diagram of another exemplary embodiment of a pixel area of an OLED display according to the invention.

FIG. 10 shows an equivalent circuit diagram of another exemplary embodiment of a pixel area of an OLED display according to the invention.

As shown in FIG. 10, one pixel area of an OLED display includes a plurality of signal lines 121, 122, 123, 124, 171 and 172, a plurality of thin film transistors T1, T2, T3, T4, T5 and T6 connected to the plurality of signal lines, a storage capacitor Cst, and an OLED LD.

The signal lines of one pixel area circuit include a scan line 121 transmitting a scan signal Sn, a previous scan line 122 transmitting a previous scan signal Sn−1 to the fourth thin film transistor T4, a light emission control line 123 transmitting a light emission control signal En to the fifth thin film transistor T5 and the sixth thin film transistor T6, a data line 171 crossing the scan line 121 and transmitting a data signal Dm, a driving voltage line 172 transmitting a driving voltage ELVDD and being substantially parallel to the data line 171, and an initialization voltage line 124 transmitting an initialization voltage Vint initializing the first thin film transistor T1.

The light emission control signal En has a different potential from the scan signal line 121 and may have a wider signal width than the scan signal Sn. In one exemplary embodiment, for example, when the scan signal Sn has a low potential, the light emission control signal En may be applied with a high potential.

The gate electrode G1 of the first thin film transistor T1 is connected to one terminal Cst1 of the storage capacitor Cst, a source electrode S1 of the first thin film transistor T1 is connected to the driving voltage line 172 through the fifth thin film transistor T5, and a drain electrode D1 of the first thin film transistor T1 is electrically connected to an anode of the OLED LD through the sixth thin film transistor T6. The first thin film transistor T1 receives the data signal Dm according to the switching operation of the switching thin film transistor T2 to supply a driving current $I_{LD}$ to the OLED LD.

The gate electrode G2 of the second thin film transistor T2 is connected to the scan line 121, a source electrode S2 of the second thin film transistor T2 is connected to the data line 171, and a drain electrode D2 of the second thin film transistor T2 is connected to the source electrode S1 of the first thin film transistor T1 and to the driving voltage line 172 through the operation control thin film transistor T5. The second thin film transistor T2 is turned on according to the scan signal Sn transmitted through the scan line 121 thereby performing a switching operation for transmitting the data signal Dm transmitted through the data line 171 to the source electrode of the first thin film transistor T1.

A gate electrode G3 of the third thin film transistor T3 is connected to the scan signal line 121, the source electrode S3 is connected to the drain electrode D1 of the first thin film transistor T1, and the drain electrode D3 is connected together to one terminal Cst1 of the storage capacitor Cst, the drain electrode D4 of the fourth thin film transistor T4 and the gate electrode G1 of the first thin film transistor T1. The third thin film transistor T3 is turned on in response to the scan signal Sn received through the scan signal line 121 to interconnect the gate electrode G1 of the first thin film transistor T1 and the second drain electrode D2 of the first thin film transistor T1, so that the first thin film transistor T1 is diode-connected.

The gate electrode G4 of the fourth thin film transistor T4 is connected to the previous scan line 122, the source electrode S4 is connected to the initialization power line 124, and the drain electrode D4 is connected to the one end Cst1 of the storage capacitor Cst, the drain electrode D3 of the third thin film transistor T3 and the gate electrode G1 of the first thin film transistor T1. The fourth thin film transistor T4 is turned on in response to the previous scan signal Sn−1 received through the previous scan line 122, and delivers the initialization voltage Vint to the gate electrode G1 of the first thin film transistor T1 to perform an initialization operation to initialize a voltage on the gate electrode G1 of the first thin film transistor T1.

The gate electrode G5 of the fifth thin film transistor T5 is connected to the light emission control line 123, the source electrode S5 of the fifth thin film transistor T5 is connected to the driving voltage line 172, and the drain electrode D5 of the fifth thin film transistor T5 is connected to the source electrode S1 of the first thin film transistor T1 and the drain electrode D2 of the second thin film transistor T2.

The gate electrode G6 of the sixth thin film transistor T6 is connected to the light emission control line 123, the source electrode S6 of the sixth thin film transistor T6 is connected to the drain electrode D1 of the first thin film transistor T1 and the source electrode S3 of the third thin film transistor T3, and the drain electrode D6 of the sixth thin film transistor T6 is electrically connected to the anode of the OLED LD. The fifth thin film transistor T5 and the sixth thin film transistor T6 are simultaneously turned on according to the light emission control signal En transmitted through the light emission control line 123 to transmit the driving voltage ELVDD to the OLED LD such that the driving current $I_{LD}$ flows to the OLED LD.

The other terminal Cst2 of the storage capacitor Cst is connected to the driving voltage line 172, and the cathode of the OLED LD is connected to the common voltage ELVSS. Accordingly, the OLED LD receives the driving current $I_{LD}$ from the first thin film transistor T1 thereby displaying the image using the emitted light from the OLED LD.

In the above pixel area circuit, the first thin film transistor T1 charges the voltage corresponding to the data signal Dm to the storage capacitor Cst according to the scan signal Sn, and the electrical current corresponding to the voltage charged to the storage capacitor Cst is provided to the organic light emitting element LD. Since the threshold voltage of the first thin film transistor T1 may vary as time passes, the compensation transistor T3 diode-connects the first thin film transistor T1 in response to the scan signal Sn so that the threshold voltage is compensated.

Figure 11:
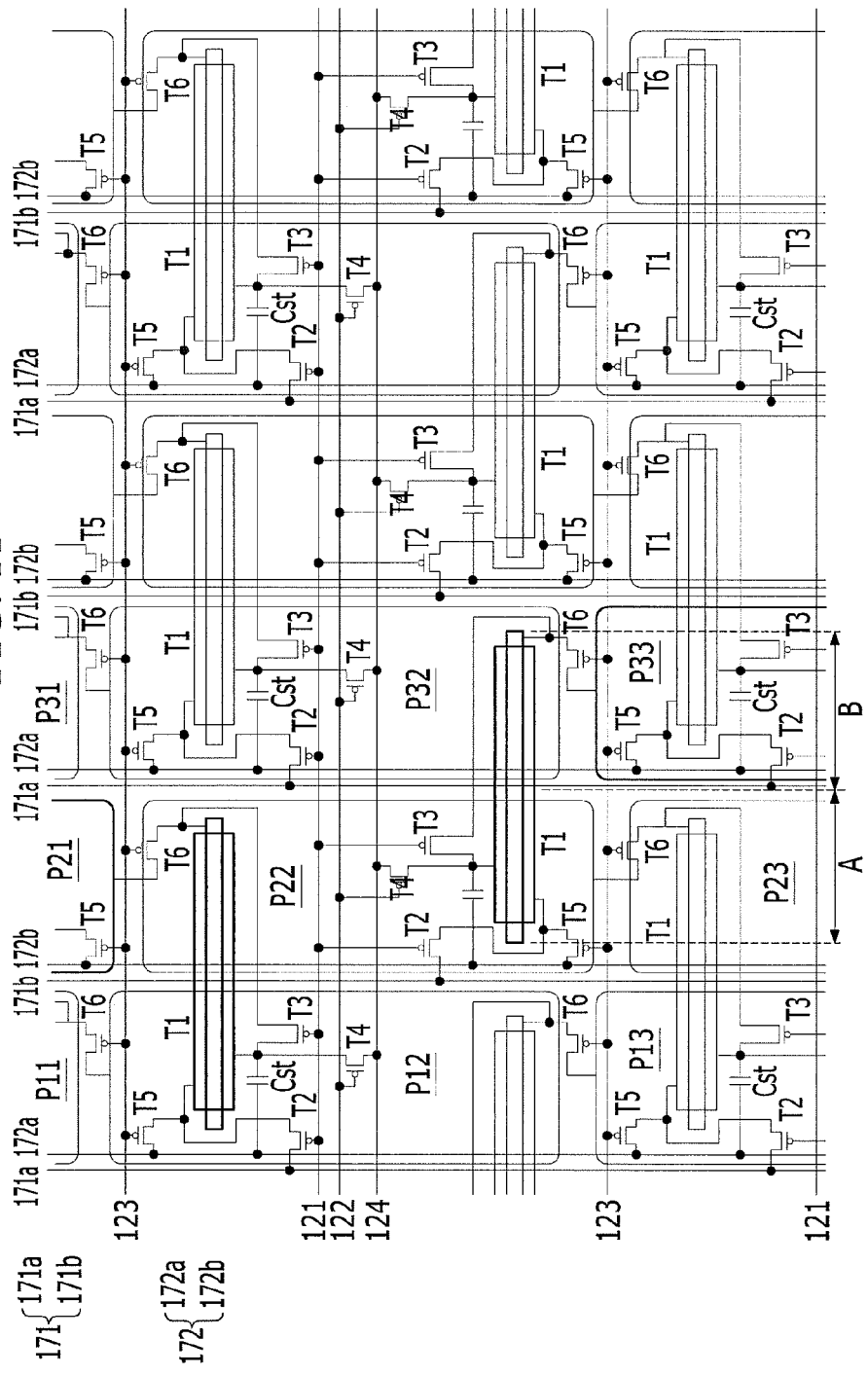
FIG. 11 is a schematic top plan view of yet another exemplary embodiment of an OLED display according to the invention.
Figure 12:
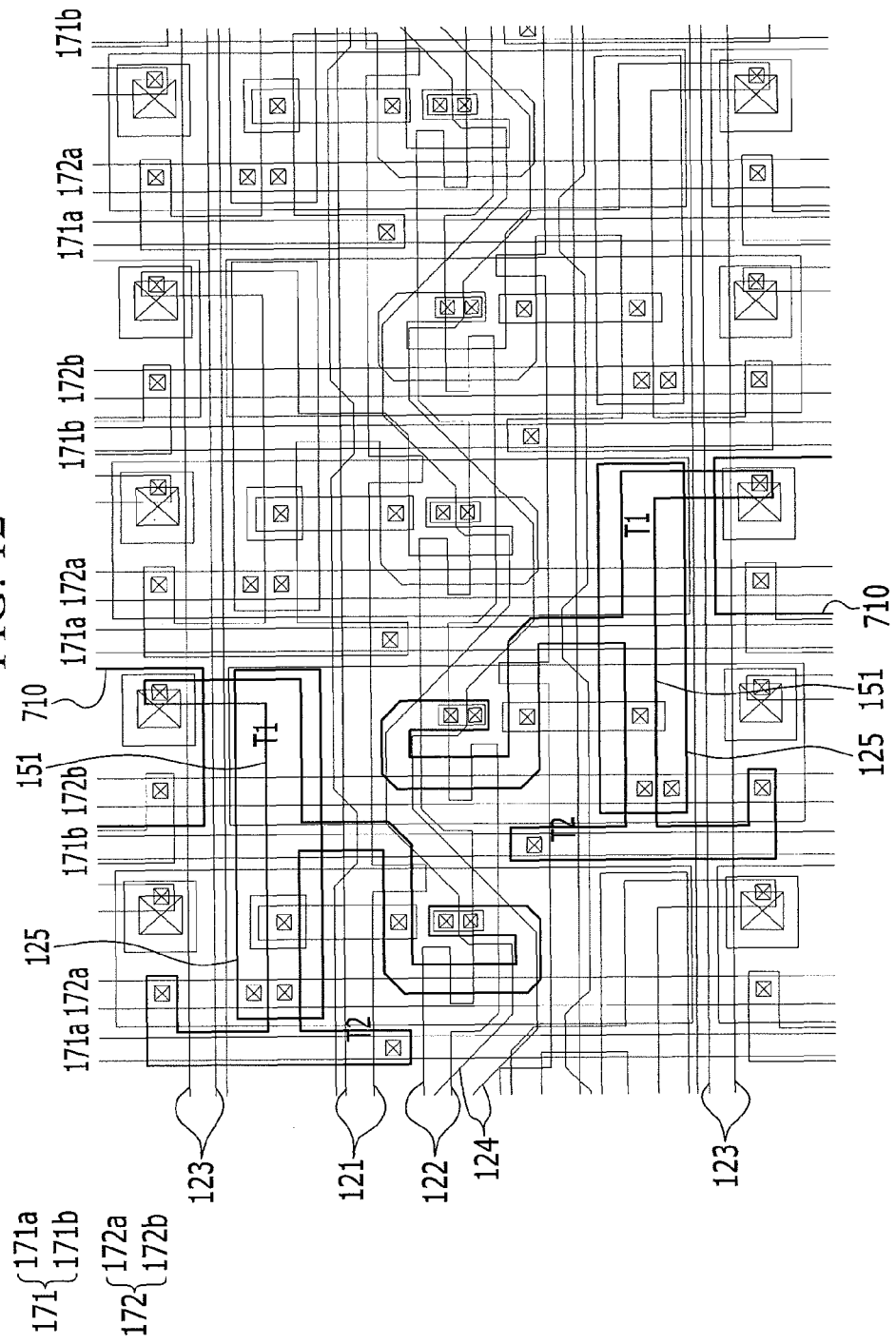
FIG. 12 is a plan view of the OLED display shown in FIG. 11.

FIG. 11 is a schematic top plan view of yet another exemplary embodiment of an OLED display according to the invention, and FIG. 12 is a plan view of the OLED display shown in FIG. 11.

As shown in FIG. 11 and FIG. 12, in the first thin film transistor T1 of the driving thin film transistor, the semiconductor 151 may be positioned over a plurality of pixel areas as shown in FIG. 1 to FIG. 4.

The illustrated exemplary embodiment is described focusing on the first thin film transistor T1 as the driving element and the second thin film transistor T2 as the switch element. The sixth thin film transistor T6 may be positioned between the first thin film transistor T1 and the first electrode 710 of the organic light emitting element. However, the sixth thin film transistor T6 is the switch controlled by the light emission control line 123 such that the first electrode 710 and the first thin film transistor T1 as the driving element will be described.

As shown in FIG. 11 and FIG. 12, the semiconductor 151 of the first thin film transistor T1 of the OLED display is disposed over two pixel areas P1 and P2, as shown in FIG. 1.

The scan signal line 121 is elongated in a first (e.g., row) direction, and the data line 171 and the driving voltage line 172 are elongated in a second (e.g., column) direction crossing the scan signal line 121.

The region in which the first electrode 710 is positioned is referred to as the pixel area.

The OLED display according to the invention includes a plurality of pixels connected to the scan signal line 121, the data line 171 and the driving voltage line 172. The plurality of pixels may be respectively disposed at a plurality of pixel areas.

When sequentially referred to as the first pixel area P1 and the second pixel area P2 from the left side of FIG. 11, the second thin film transistor T2 of the first pixel area P1 and the second pixel area P2 is connected to the same scan signal line 121 and different data lines 171a and 171b.

The semiconductor 151 of the first thin film transistor T1 includes the first portion A including the source region and the second portion B including the drain region. The channel region is positioned between the source region and the drain region and a portion thereof is included in both the first portion and the second portion.

The semiconductor of the first thin film transistor T1 is formed over the first pixel area P1 and the second pixel area P2, the first portion A is positioned at the first pixel area P1, and the second portion B is positioned at the second pixel area P2. Accordingly, the source region and the drain region are positioned at different pixel areas, and the channel region is positioned at these two different pixel areas in which the source region and the drain region are positioned. The first electrode 710 of the organic light emitting element connected to the first thin film transistor T1 is positioned at the same column as and a row following the second portion B, however, the organic light emitting element may be positioned at a prior row or a following row with respect to the row where the second portion B is positioned.

If the pixel areas of FIG. 11 are referred to as P11, P12, P13, P21, P22, P23, P31, P32 and P33 according to the rows and columns, the pixel area positioned at P12 is referred to as the first pixel area P1, and the pixel area positioned at P22 is referred to as the second pixel area P2.

The first portion A of the first thin film transistor T1 positioned at the first pixel area P1 is positioned at P12 of the first pixel area P1, and the second portion B is positioned at P22 of the second pixel area P2. Also, the first electrode 710 connected to the second portion B is positioned at P21 as a row prior to P22.

Also, the first portion A of the first thin film transistor T1 positioned at the second pixel area P2 is positioned at P22 of the second pixel area P2, and the second portion B is positioned at P32 of the neighboring pixel area. Also, the first electrode 710 connected to the second portion B is positioned at P33 as a row following P32.

As described above, exemplary embodiments have been disclosed with detailed description with reference to the drawings. The terms are used to merely illustrate the exemplary embodiment of the invention but not to limit the scope of the invention recited in the claims to the exemplary embodiment of the invention. Therefore, those skilled in the art will understand that various modifications and other equivalent exemplary embodiments are possible. Accordingly, the true technical scope of the invention to be protected should be defined by the technical idea of the following claims.

What is claimed is:

1. An organic light emitting diode display comprising:
   a substrate comprising a plurality of pixel areas;
   a plurality of switching transistors and a plurality of driving transistors on the substrate; and
   an organic light emitting element connected to a switching transistor and a driving transistor among the plurality of switching transistors and the plurality of driving transistors,
   wherein
   the driving transistor connected to the organic light emitting element comprises a semiconductor which overlaps a plurality of adjacent pixel areas, and
   organic light emitting elements disposed in the adjacent pixel areas are connected to different driving transistors among the plurality of driving transistors, each of the different driving transistors comprises a multi-pixel area overlapping semiconductor, and the multi-pixel area overlapping semiconductors of the different driving transistors are separated from each other.

2. The organic light emitting diode display of claim 1, wherein:

the multi-pixel area overlapping semiconductor comprises a source region, a channel region and a drain region; and the channel region of the multi-pixel area overlapping semiconductor is disposed in the plurality of adjacent pixel areas which are overlapped by the driving transistor.

3. The organic light emitting diode display of claim 1, wherein:

the multi-pixel area overlapping semiconductor comprises a source region, a channel region and a drain region; and the source region and the drain region are disposed in different pixel areas among the plurality of adjacent pixel areas which are overlapped by the driving transistor.

4. The organic light emitting diode display of claim 3, wherein the channel region of the multi-pixel area overlapping semiconductor is disposed in the different pixel areas in which the source region and the drain region are disposed.

5. The organic light emitting diode display of claim 4, wherein:

the plurality of pixel areas form rows and columns, and in the columns, the source regions and the drain regions of driving transistors connected to organic light emitting elements different from each other, are alternately disposed.

6. The organic light emitting diode display of claim 5, wherein the alternating source regions and drain regions of the driving transistors connected to the organic light emitting elements different from each other, are disposed in a same pixel area.

7. The organic light emitting diode display of claim 4, wherein:

the plurality of pixel areas form rows and columns; and in the columns, the source regions or the drain regions of driving transistors connected to the organic light emitting elements different from each other, are repeated.

8. The organic light emitting diode display of claim 3, wherein a portion of the multi-pixel area overlapping semiconductor channel region is disposed in a pixel area between the different pixel areas in which the source region and the drain region of the multi-pixel area overlapping semiconductor are disposed.

9. The organic light emitting diode display of claim 8, wherein:

the plurality of pixel areas form rows and columns; and in the columns, the source regions, the channel regions and the drain regions of driving transistors connected to organic light emitting elements different from each other, are alternately disposed.

10. The organic light emitting diode display of claim 9, wherein the alternating source regions, channel regions and drain regions of the driving transistors connected to the organic light emitting elements different from each other, are disposed in a same pixel area.

11. The organic light emitting diode display of claim 8, wherein:

the plurality of pixel areas form rows and columns; and in the columns, the source regions, the channel regions or the drain regions of driving transistors connected to organic light emitting elements different from each other, are repeated.

12. The organic light emitting diode display of claim 3, wherein:

the organic light emitting element comprises:

a first electrode connected to the drain region of the multi-pixel area overlapping semiconductor, an organic emission layer on the first electrode, and a second electrode on the organic emission layer; and the first electrode is disposed in a same pixel area in which the drain region of the multi-pixel area overlapping semiconductor is disposed.

13. The organic light emitting diode display of claim 1, wherein:

the multi-pixel area overlapping semiconductor comprises a source region, a drain region and a channel region;

the source region and the drain region of the multi-pixel area overlapping semiconductor are disposed in different pixel areas among the plurality of adjacent pixel areas which are overlapped by the driving transistor;

the organic light emitting element comprises:

a first electrode connected to the drain region of the multi-pixel area overlapping semiconductor, an organic emission layer on the first electrode, and a second electrode on the organic emission layer; and the first electrode is disposed in a different pixel area from that in which the drain region of the multi-pixel area overlapping semiconductor is disposed.

14. The organic light emitting diode display of claim 3, wherein the driving transistor further comprises:

a source electrode connected to the source region of the multi-pixel area overlapping semiconductor; and a drain electrode connected to the drain region of the multi-pixel area overlapping semiconductor.

15. The organic light emitting diode display of claim 2, further comprising:

a plurality of scan signal lines on the substrate; and a plurality of data lines and driving voltage lines crossing the scan signal lines, wherein the plurality of adjacent pixel areas overlapped by the driving transistor forms a group, the switching transistors disposed in the pixel areas forming the group are connected to different data lines, and the driving transistors disposed in the pixel areas forming the group are connected to different driving voltage lines.

16. The organic light emitting diode display of claim 15, wherein:

a scan signal line among the plurality of scan signal lines comprises: a first sub-scan signal line portion and a second sub-scan signal line portion which are simultaneously applied with a signal; and the switching transistors disposed in the pixel areas forming the group comprise a first switching transistor connected to the first sub-scan signal line portion and a second switching transistor connected to the second sub-scan signal line portion.

17. The organic light emitting diode display of claim 2, further comprising:

a plurality of scan signal lines on the substrate; and a plurality of data lines and driving voltage lines crossing the scan signal lines, wherein the plurality of adjacent pixel areas overlapped by the driving transistor forms a group, the switching transistors disposed in the pixel areas forming the group are connected to different data lines, and the driving transistors disposed in the pixel areas forming the group are connected to a same driving voltage line.

* * * * *